United States Patent
Lellapalli et al.

(10) Patent No.: US 11,508,352 B2
(45) Date of Patent: Nov. 22, 2022

(54) METHOD AND SYSTEM FOR NOISE SUPPRESSION

(71) Applicant: Carrier Corporation, Palm Beach Gardens, FL (US)

(72) Inventors: Durga Mounika Lellapalli, Telangana (IN); Swathi Palanki, Telangana (IN); Ricard Burriel, Barcelona (ES)

(73) Assignee: CARRIER CORPORATION, Palm Beach Gardens, FL (US)

( * ) Notice: Subject to any disclaimer, the term of this patent is extended or adjusted under 35 U.S.C. 154(b) by 6 days.

(21) Appl. No.: 17/097,264

(22) Filed: Nov. 13, 2020

(65) Prior Publication Data
US 2021/0151027 A1     May 20, 2021

(30) Foreign Application Priority Data
Nov. 15, 2019 (EP) .................................... 19383009

(51) Int. Cl.
*G10K 11/178*     (2006.01)
*H03F 3/21*     (2006.01)
*G08B 17/10*     (2006.01)

(52) U.S. Cl.
CPC ........ *G10K 11/17873* (2018.01); *G08B 17/10* (2013.01); *H03F 3/21* (2013.01);
(Continued)

(58) Field of Classification Search
CPC ........... G08B 17/10–125; F04D 29/663; F24F 13/24; H04R 1/1083; H04R 25/453; G10K 11/17873; G10K 11/178; G10K 11/17883; G10K 11/17823; G10K 2210/105; G10K 2210/3011; G10K 2210/3027; G10K 2210/3044; G10K 2210/3056;
(Continued)

(56) References Cited

U.S. PATENT DOCUMENTS 5,625,684 A * 4/1997 Matouk ............ G10K 11/17881
379/392.01
7,551,743 B1 * 6/2009 Tsujishita ............... G11B 20/24
381/2

(Continued)

OTHER PUBLICATIONS

European Search Report for Application No. 19383009.8; dated May 12, 2020; 9 Pages.

*Primary Examiner* — Leshui Zhang
(74) *Attorney, Agent, or Firm* — Cantor Colburn LLP

(57) ABSTRACT

Aspects of the invention are directed towards a system and method for noise suppression. One or more embodiments of the invention describe the method comprising steps of receiving noise by a microphone and deriving a noise signal from the noise, the noise produced by a fan of a fire/smoke detection unit while drawing air and detecting the speed of the fan of the fire/smoke detection unit. The method further describes steps of amplifying the noise signal by the amplifier received from the microphone and producing an anti-phase noise signal by shifting a phase of the amplified noise signal received from the amplifier wherein the anti-phase noise signal is dependent on the detected speed of the fan. The method further describes steps of outputting the anti-phase noise signal through a speaker to suppress the noise produced by the fan of the fire/smoke detection unit while drawing the air.

17 Claims, 5 Drawing Sheets

(52) U.S. Cl.
CPC .......... *G10K 2210/105* (2013.01); *G10K 2210/3011* (2013.01); *G10K 2210/3027* (2013.01); *G10K 2210/3044* (2013.01); *G10K 2210/3056* (2013.01); *H03F 2200/03* (2013.01)

(58) Field of Classification Search
CPC .............. G10K 2210/12; G10K 2210/109; H03F 3/21; H03F 2200/03
USPC ........ 381/71.1–71.14, 317, 66, 56, 57, 73.1, 381/72, 77, 79, 83, 86, 91, 92, 93, 381/94.1–94.9, 95, 97, 98, 99, 100, 101, 381/102, 103, 104, 106, 107, 108, 110, 381/120, 121, 111, 112, 113, 114, 115; 327/551, 552, 553, 555, 560; 704/E21.007, E21.02; 379/406.01–406.16
See application file for complete search history.

(56) References Cited

U.S. PATENT DOCUMENTS

| | | | |
|---|---|---|---|
| 7,693,292 B1 | 4/2010 | Gross et al. | |
| 2005/0094823 A1* | 5/2005 | Kobori | G10K 11/17853 381/71.5 |
| 2010/0271219 A1* | 10/2010 | Lang | G08B 17/10 340/628 |
| 2012/0288112 A1* | 11/2012 | Yang | G10K 11/17853 381/71.8 |

* cited by examiner

METHOD AND SYSTEM FOR NOISE SUPPRESSION

FOREIGN PRIORITY

This application claims priority to European Patent Application No. 19383009.8, filed Nov. 15, 2019, and all the benefits accruing therefrom under 35 U.S.C. § 119, the contents of which in its entirety are herein incorporated by reference.

TECHNICAL FIELD OF INVENTION

The present invention generally relates to fire/smoke detection systems. More particularly, the invention relates to a system and a method for suppressing noise produced by a fire/smoke detection unit.

BACKGROUND OF THE INVENTION

Safety of people is of utmost importance and to save people from any untoward situation is a major concern. Over a period of time, several preventive measures have been taken to save people from any untoward incidents like smoke/fire breakouts. Such preventive measures may involve deploying several fire/smoke detectors (such as aspirating smoke detector/s (ASD)) in a premises (e.g. building, floors, rooms, museums, hospitals, colleges etc.). Such aspirating smoke detector/s raises alarm or notify people present in the premises on sensing presence of smoke/fire particles in air.

The aspirating smoke detector deploy one or more fans to draw air from their surroundings. When the fan/s draws air from the surroundings, it produces noise. Such noise disturbs people present in the premises and may cause discomfort to them. At present, there is no solution available in the market that eliminates disturbance by the noise originating from the one or more fans of the aspirating smoke detector/s.

In view of the afore-mentioned problems in the existing solutions, there is a need of an efficient and effective system and method for eliminating disturbance caused by noise originating by one or more fans of aspirating smoke detector/s. There is also a need to eliminate discomfort caused to the people by such noise. In order to solve problems in the existing solutions, a system and a method are disclosed.

SUMMARY OF THE INVENTION

Various embodiments of the invention describe a system for suppressing noise produced by a fire/smoke detection unit. The system comprises a fire/smoke detection unit and a noise cancellation unit communicably coupled with the fire/smoke detection unit. The fire/smoke detection unit comprises a fan adapted to draw air through a conduit, the fan producing noise while drawing the air. The noise cancellation unit comprises a microphone adapted to receive the noise of the fan and derive a noise signal from the noise. There is a speed detection unit to detect the speed of the fan. The noise cancellation unit also comprises an amplifier adapted to amplify the noise signal received from the microphone and a phase-shift unit adapted to shift a phase of the amplified noise signal received from the amplifier to produce an anti-phase noise signal. The anti-phase noise signal is dependent on the detected speed of the fan. The noise cancellation unit further comprises a speaker adapted to output the anti-phase noise signal received from the phase-shift unit.

In an embodiment of the invention, the anti-phase noise signal suppresses the noise produced by the fan of the fire/smoke detection unit.

In another embodiment of the invention, an amplitude of the anti-phase noise signal is based on the speed of the fan.

In yet another embodiment of the invention, the noise signal and the anti-phase noise signal are at 180 degree of phase shift with respect to each other.

In still another embodiment of the invention, the amplifier amplifies the noise signal based on a threshold value required to suppress the noise produced by the fan.

In a different embodiment of the invention, the microphone and the fan are located in proximity with each other. Also, the speaker and the fan are located in proximity with each other.

In yet another embodiment of the invention, the noise cancellation unit comprises a power amplifier to amplify the anti-phase noise signal produced by the phase-shift unit.

In another embodiment of the invention, the fan and the conduit are coupled with the fire/smoke detection unit. Also, the fire/smoke detection unit is placed inside a premises.

In an embodiment of the invention, the speed of the fan is mapped with the frequency/amplitude of the anti-phase noise signal.

Various embodiments of the invention describe a method for suppressing noise produced by a fire/smoke detection unit. The method comprises steps of receiving noise by a microphone and deriving a noise signal from the noise. The noise is produced by a fan of a fire/smoke detection unit while drawing air. The speed of the fan is detected. The method also comprises the step of amplifying the noise signal by the amplifier received from the microphone and producing an anti-phase noise signal by shifting a phase of the amplified noise signal received from the amplifier wherein the anti-phase noise signal is dependent on the detected speed of the fan. The method comprises further steps of outputting the anti-phase noise signal through a speaker.

In an embodiment of the invention, the anti-phase noise signal suppresses the noise produced by the fan of the fire/smoke detection unit.

In another embodiment of the invention, an amplitude of the anti-phase noise signal is based on the speed of the fan.

In yet another embodiment of the invention, the noise signal and the anti-phase noise signal are at 180 degree of phase shift with respect to each other.

In still another embodiment of the invention, the amplifier amplifies the noise signal based on a threshold value required to suppress the noise produced by the fan.

In a different embodiment of the invention, the microphone and the fan are located in proximity with each other. Also, the speaker and the fan are located in proximity with each other.

In yet another embodiment of the invention, the anti-phase noise signal produced by the phase-shift unit is amplified by a power amplifier.

In another embodiment of the invention, the fan draws air through a conduit coupled with the fire/smoke detection unit.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

Other aspects, advantages, and salient features of the invention will become apparent to those skilled in the art from the following detailed description, which taken in conjunction with the annexed drawings, discloses exemplary embodiments of the invention.

BRIEF DESCRIPTION OF THE DRAWINGS

Corresponding reference numerals indicate corresponding parts throughout the drawings.

DETAILED DESCRIPTION OF THE INVENTION

Figure 1:
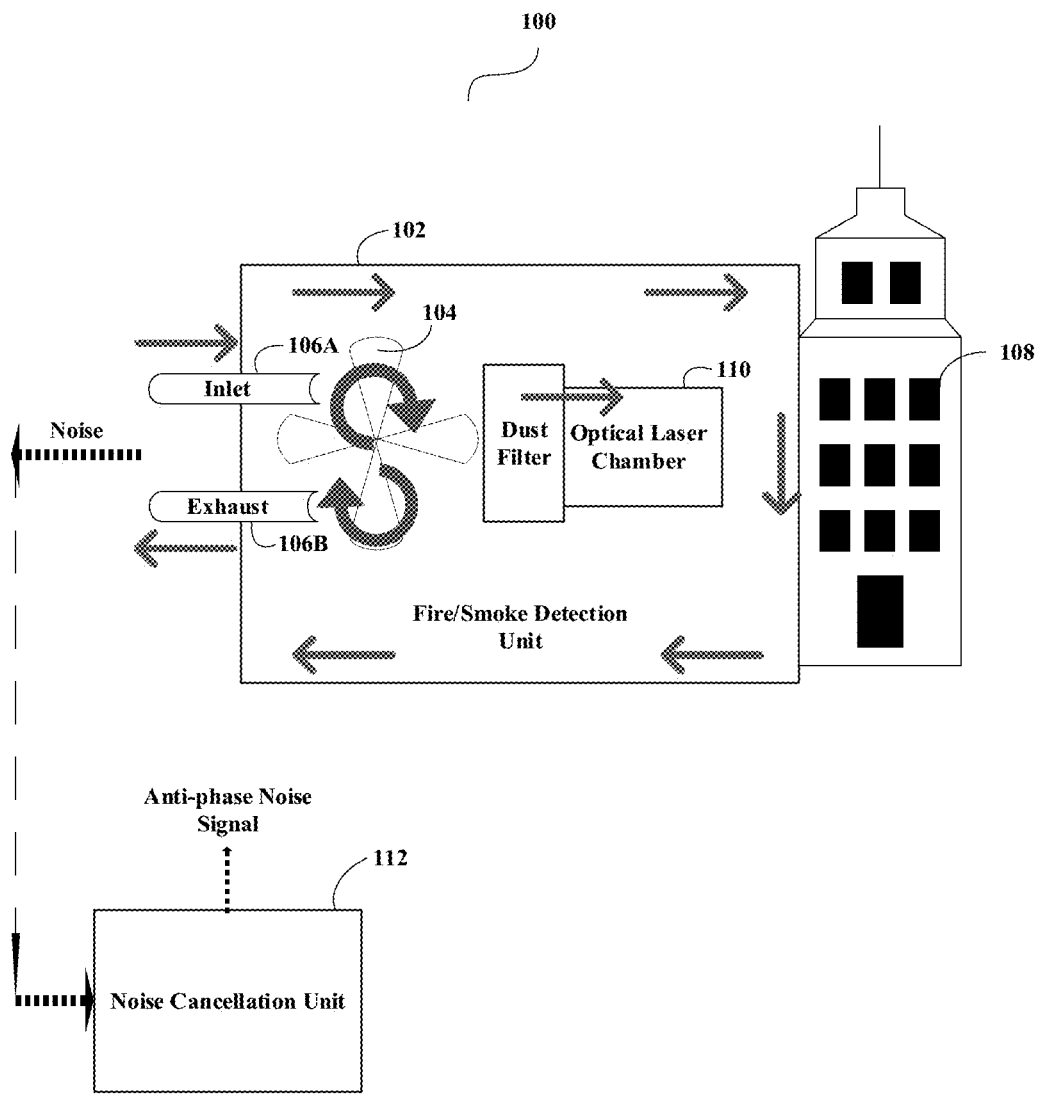
FIG. 1 depicts an exemplary system architecture according to an exemplary embodiment of the invention.

Described herein is the technology with a system and a method for suppressing noise produced by a fire/smoke detection unit/s. The fire/smoke detection unit/s may be installed in a premises to detect fire/smoke in the premises. To detect fire/smoke in the premises, the fire/smoke detection unit/s may comprise one or more fans to draw air from surroundings or present in the premises. The one or more fans may draw air from the surroundings through conduit/s. When the one or more fans draw air from the surroundings through the conduit/s, the one or more fans may produce noise in the premises.

In order to suppress the noise produced by the one or more fans of the fire/smoke detection unit/s, a noise cancellation unit communicably coupled with the fire/smoke detection unit/s may be used. The noise produced by the one or more fans may be provided as an input to the noise cancellation unit. The input to the noise cancellation unit may be provided through a microphone of the noise cancellation unit. The microphone may derive a noise signal from the noise as inputted to the microphone. Also, speed of the fan is detected by the noise cancellation unit. Then, the noise signal may be amplified by an amplifier and the amplified noise signal may be provided to a phase-shift unit. The phase-shift unit may produce an anti-phase noise signal based on the amplified noise signal and the anti-phase noise signal may be dependent on the detected speed of the fan. The anti-phase noise signal may be outputted by a speaker to suppress the noise produced by the fire/smoke detection unit/s.

As used herein, the premises may be rooms, floors or a building where the fire/smoke detection unit/s may be installed. Also, the fire/smoke detection unit/s may cover a distance range of 50 meters to 200 meters. Further, several fire/smoke detection unit/s may be installed in each of the room or floor. For an instance, each room may have 5 fire/smoke detection unit/s installed or each floor may have 50 fire/smoke detection unit/s installed or a building may have 500 fire/smoke detection unit/s.

As used herein, the fire/smoke detection unit/s may detect presence of fire/smoke in the air. The fire/smoke detection unit/s may comprise, but is not limited to, one or more fans to draw air from surroundings through conduits, nephelometer, fire/smoke chamber, dust filter/s, battery, and/or sensors. The fire/smoke detection unit/s may be an aspirating smoke detector (ASD) or any such detector having one or more fans producing the noise and is well known in the art.

As used herein, the microphone may be a transducer for converting sound of the noise produced by the one or more fans to a noise signal (i.e. an electrical signal). The microphones may be a capacitor microphone or an electrostatic microphone, a RF condenser microphones, an electret microphone, a dynamic microphone, crystal microphone or piezo microphones, fiber-optic microphones, laser microphones, MicroElectrical-Mechanical System (MEMS) microphones, or any such microphone/s that is well known in the art.

As used herein, the amplifier may be an electronic component for amplifying the noise signal. The amplifier may either increase amplitude of the noise signal. The amplifier may be a power amplifier, an operational amplifier (op-amp), a distributed amplifier, a switched mode amplifier, negative resistance amplifier or any such amplifier that is well known in the art.

As used herein, the phase-shift unit may be a device for changing a phase (in degrees) of the amplified noise signal to produce an anti-phase noise signal, as described herein in the specification. Such phase-shift unit may shift the phase that is well known in the art.

As used herein, the speaker may be a wired speaker or wireless speaker that converts the anti-phase noise signal into sound and outputs the sound. Such speaker may be a loudspeaker or any such speaker that is well known in the art.

FIG. 1 depicts a system architecture 100 for suppressing noise produced by one or more fire/smoke detection units, according to an exemplary embodiment of the invention. As depicted in FIG. 1, the one or more fire/smoke detection units 102 may be installed in a premises 108. The fire/smoke detection units 102 may comprise one or more fans 104 for drawing air from the premises 108 or from surroundings. The air may be drawn by the one or more fans 104 through an inlet conduit 106A coupled/attached with the one or more fans 104. The conduit/s 106A may provide the air to a dust filter and then to a fire/smoke chamber 110 that detect presence of fire/smoke particles in the air. In an exemplary embodiment, the detection of presence of fire/smoke particles in the air may be performed by light scattered by the fire/smoke particles in the air. When the fire/smoke chamber 110 of the fire/smoke detection units 102 detects that the fire/smoke particles present in the air are above a specified threshold, then, the fire/smoke detection units 102 may raise an alarm to notify people present in the premises 108. Also, the air may exit the fire/smoke detection units 102 through an exhaust conduit 106B coupled/attached with the one or more fans 104 as shown in the FIG. 1. The other methods of detecting the smoke/fire are also within the scope of the present invention.

Also, when the one or more fans 104 of the fire/smoke detection units 102 draws air from the premises 108 or from surroundings, the one or more fans 104 produce noise. To suppress the noise produced by one or more fans 104, a noise cancellation unit 112 may be used that is communicably coupled with the fire/smoke detection units 102. The details of how different components of the noise cancellation unit 112 suppresses the noise has been explained in FIG. 2.

Although FIG. 1 depicts that the fire/smoke detection units 102 outside the premises 108; however, it is understood by a person killed in the art that the fire/smoke detection units 102 is installed inside or outside or at any place relative to the premises 108. Although FIG. 1 depicts only one fan 104 in the premises 108; however; it is understood by a person killed in the art that the premises 108 may have any number of fans installed at several places of the premises 108.

Figure 2:
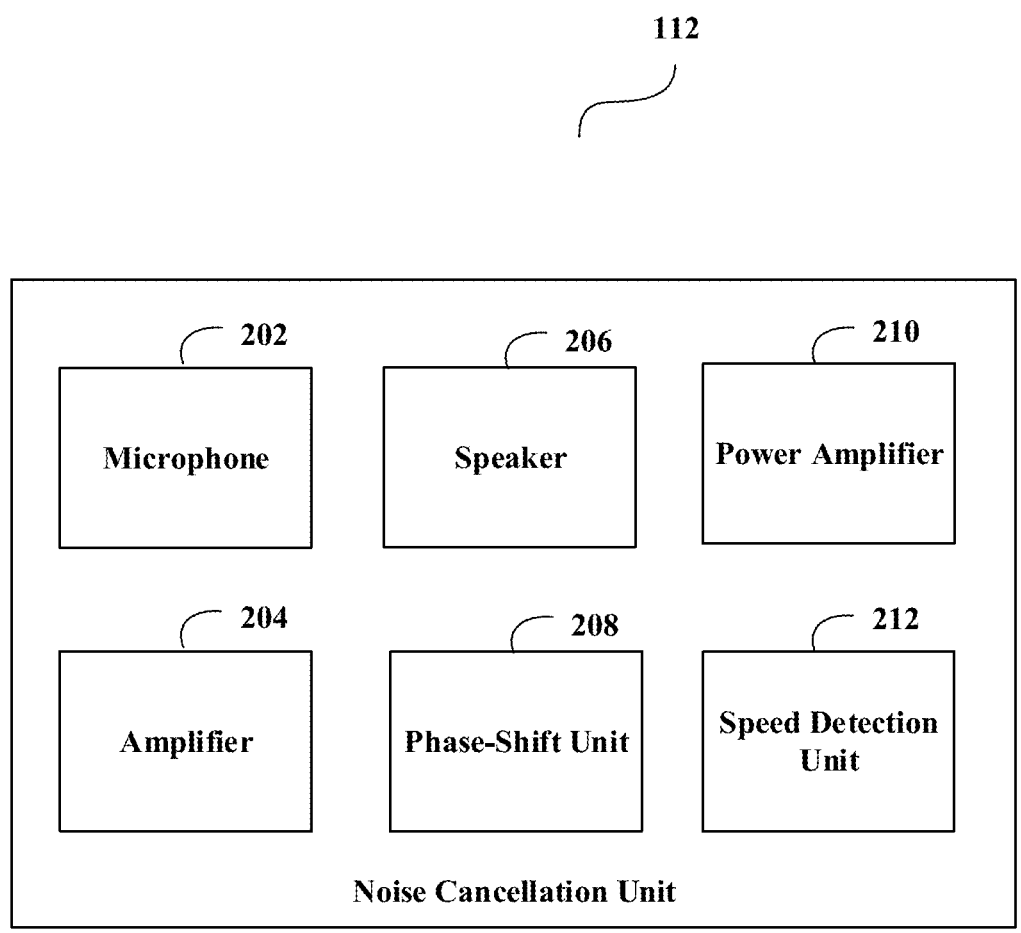
FIG. 2 depicts an exemplary block diagram of different components of a noise cancellation unit communicably coupled with a fire/smoke detection unit according to an exemplary embodiment of the invention.

FIG. 2 depicts a block diagram of different components of a noise cancellation unit 112 communicably coupled with fire/smoke detection units 102 for suppressing noise produced by one or more fans 104 of the fire/smoke detection units 102 according to an exemplary embodiment of the invention. The noise cancellation unit 112 may comprise of, but is not limited to, a microphone 202, an amplifier 204, a speaker 206, a phase-shift unit 208 a power amplifier 210 and/or a speed detection unit 212. When the one or more fans 104 of the fire/smoke detection unit 102 produces noise, the microphone 202 may be adapted to receive the noise from the one or more fans 104 as an input. The microphone 202 and the one or more fans 104 are located in proximity with each other so that the microphone 202 receive the noise from the one or more fans 104 as an input. On receiving the noise from the one or more fans 104, the microphone 202 may be adapted to derive a noise signal and provide the noise signal to the amplifier 204 and/or the speed detection unit 212 of the noise cancellation unit 112. Also, the speed detection unit 212 may be adapted to detect a speed of the one or more fans 104 of the fire/smoke detection unit 102. In an exemplary embodiment, the speed of the one or more fans 104 may be detected based on an amplitude or a frequency of the noise signal as derived by the microphone 202. For an instance, the speed of a fan may be determined as 30 rotations per minute.

The amplifier 204 may be adapted to amplify the noise signal received from the microphone 202. In an exemplary embodiment, the amplifier 204 may amplify an amplitude of the noise signal. After amplifying the noise signal, the amplifier 204 may be adapted to output an amplified noise signal and may also be adapted to provide the amplified noise signal to a phase-shift unit 208. The phase-shift unit 208 may be adapted to shift a phase of the amplified noise signal to produce an anti-phase noise signal. In an exemplary embodiment, the phase-shift unit 208 may shift or change a phase of the amplified noise signal by 180 degrees. Further, the phase-shift unit 208 may shift or change a phase of the amplified noise signal in such a way that the anti-phase noise signal is an inverted image of the noise signal. The amplification of the noise signal and phase shifting of the amplified noise signal has been explained in FIG. 3 with an example.

Moreover, the anti-phase noise signal may be dependent on the detected speed of the one or more fans 104 of the fire/smoke detection unit 102. The phase-shift unit 208 may produce a phase shifted anti-phase noise signal based on the detected speed of the one or more fans 104. Also, the detected speed of the one or more fans 104 may be mapped with the amplitude and/or frequency of the anti-phase noise signal as the amplitude and/or the frequency of the fans 104 are effected by speed of the fans 104. Considering an example, if the speed of a fan is 30 rotations per minute, then the anti-phase noise signal may be produced in such a way that the anti-phase noise signal (when outputted) should be able to suppress the noise made by the fan in each rotation per minute. In this case, the amplitude of the anti-phase noise signal may be calculated as 80 decibels (dB) to suppress the noise.

In one exemplary embodiment, the phase-shift unit 208 may also be adapted to provide the anti-phase noise signal to the speaker 206. The speaker 206 may be adapted to output the anti-phase noise signal received from the phase-shift unit 208. The speaker 206 may output the anti-phase noise signal as sound. For this, the speaker 206 and the one or more fans 104 are also located in proximity with each other in order to suppress the noise produced by the one or more fans 104 of the fire/smoke detection unit 102.

In alternative exemplary embodiment, the phase-shift unit 208 may also be adapted to provide the anti-phase noise signal to the power amplifier 210. The power amplifier 210 may be adapted to amplify the anti-phase noise signal received from the phase-shift unit 208. In an exemplary embodiment, the power amplifier 210 may amplify a frequency of the anti-phase noise signal. In another exemplary embodiment, the power amplifier 210 may amplify an amplitude of the anti-phase noise signal. The amplification of the anti-phase noise signal may also be dependent on speed of the one or more fans 104. The anti-phase noise signal may be amplified by the power amplifier 210 in such a way that the anti-phase noise signal (when outputted) should be able to suppress the noise made by a fan 104 in each rotation per minute. After amplifying the anti-phase noise signal, the power amplifier 210 may be adapted to output an amplified anti-phase noise signal and may also be adapted to provide the amplified anti-phase noise signal to the speaker 206. The speaker 206 may be adapted to output the anti-phase noise signal received from the phase-shift unit. This would cancel/suppress the noise produced by the one or more fans 104 of the fire/smoke detection unit 102. For an instance, 39 decibel of noise is measured at 1 meter distance in a single detector 102 at blower speed 6 and 61 decibels of noise is measured in a single detector 102 at blower speed 16. The present invention cancels/suppresses such noise to a great extent.

The different units described herein are exemplary. The invention may be performed using one or more units. For example, the tasks executed by the microphone 202, the amplifier 204, the speaker 206, the phase-shift unit 208, the power amplifier 210 and/or the speed detection unit 212 may be performed by a single unit. Alternatively more number of units as described herein may be used to perform the invention.

Figure 3A:
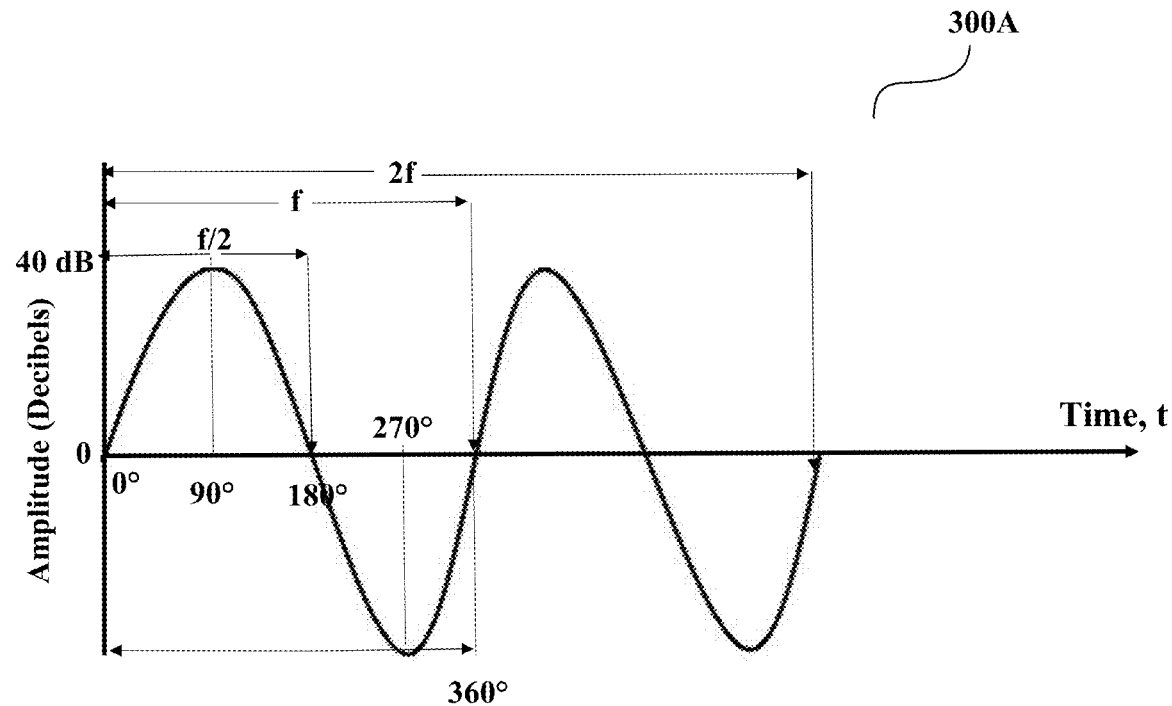
FIG. 3A depicts an exemplary noise signal.
Figure 3B:
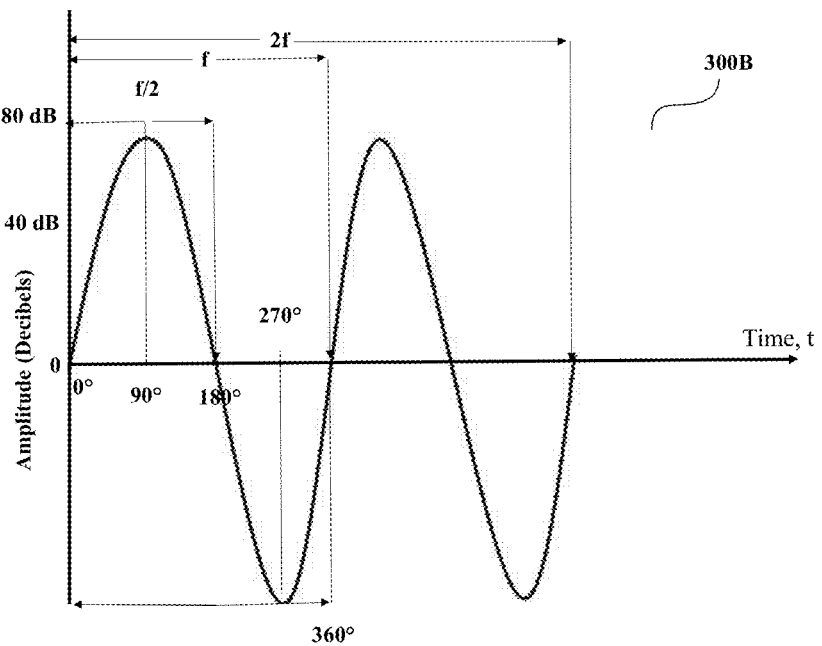
FIG. 3B depicts an exemplary amplified noise signals amplified by amplitude and FIG. 3C depict exemplary anti-phase noise signal according to an exemplary embodiment of the invention.
Figure 3C:
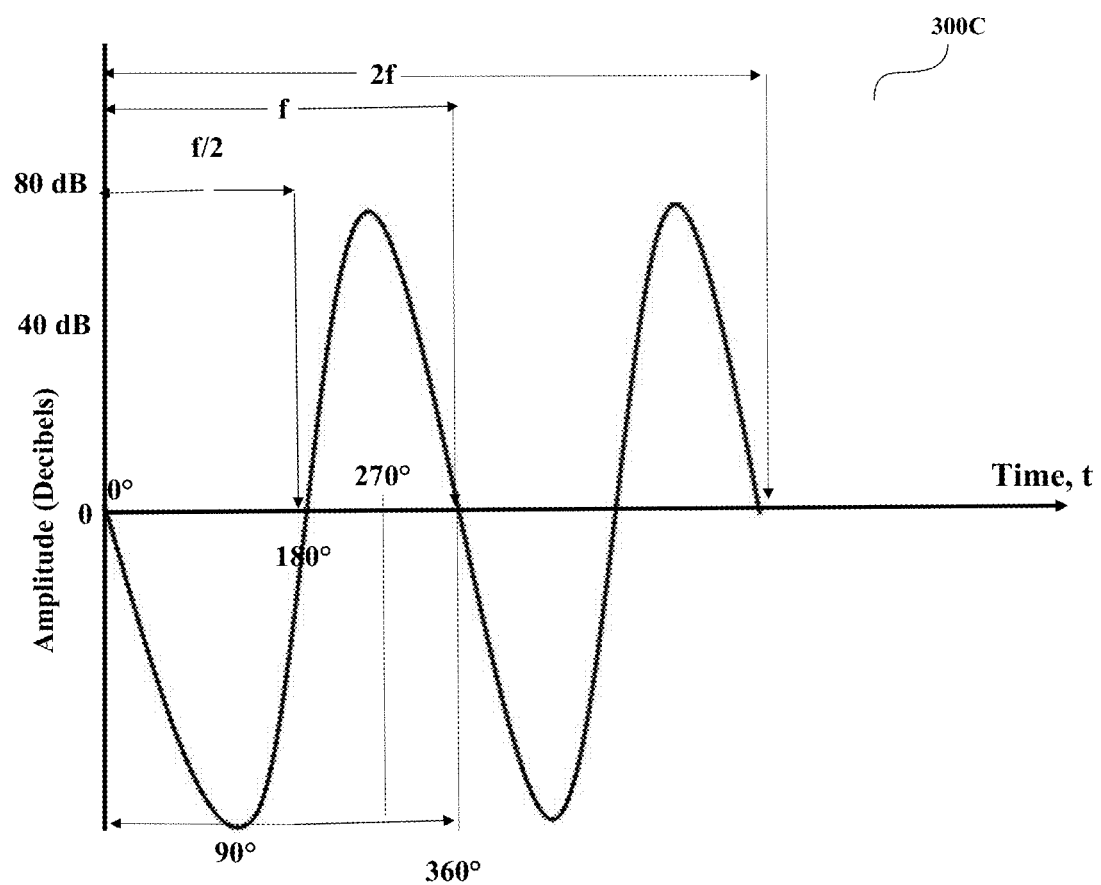

FIG. 3A depicts an exemplary noise signal, FIG. 3B depicts an exemplary amplified noise signals amplified by amplitude and FIG. 3C depict exemplary anti-phase noise signal according to an exemplary embodiment of the invention. As can be seen, the exemplary noise signal 300A in FIG. 3A has a single frequency (i.e. "f") in one cycle of 360 degree. At 180 degree, the exemplary noise signal 300A has f/2 as frequency. Referring to FIG. 3B, when the exemplary noise signal 300A is amplified by the amplifier 204, the amplified noise signal 300B is produced when the amplifier 204 amplifies the exemplary noise signal 300A by amplitude. As can be seen, the exemplary amplified noise signal 300B has 80 decibels (dB) measured as amplitude whereas the exemplary noise signal 300A has 40 decibels (dB) measured as amplitude. Referring to FIG. 3C, when the exemplary amplified noise signal 300B (by amplitude) is phase-shifted by 180 degrees by a phase-shift unit 208, the exemplary anti-phase noise signal 300C is produced by the phase-shift unit 208. As can be seen, the exemplary anti-phase noise signal 300C is an inverted image of the exemplary amplified noise signal 300B.

The amplifier 204 may amplify the exemplary noise signal 300A based on a threshold value of amplitude that would be required to suppress the noise produced by the one or more fans 104. Such threshold value may be automatically determined by the amplifier 204 on analyzing the exemplary noise signal 300A and by taking the speed of the one or more fans 104 into consideration. Accordingly, the amplifier 204 may amplify the exemplary noise signal 300A to increase power of the exemplary noise signal 300A.

Figure 4:
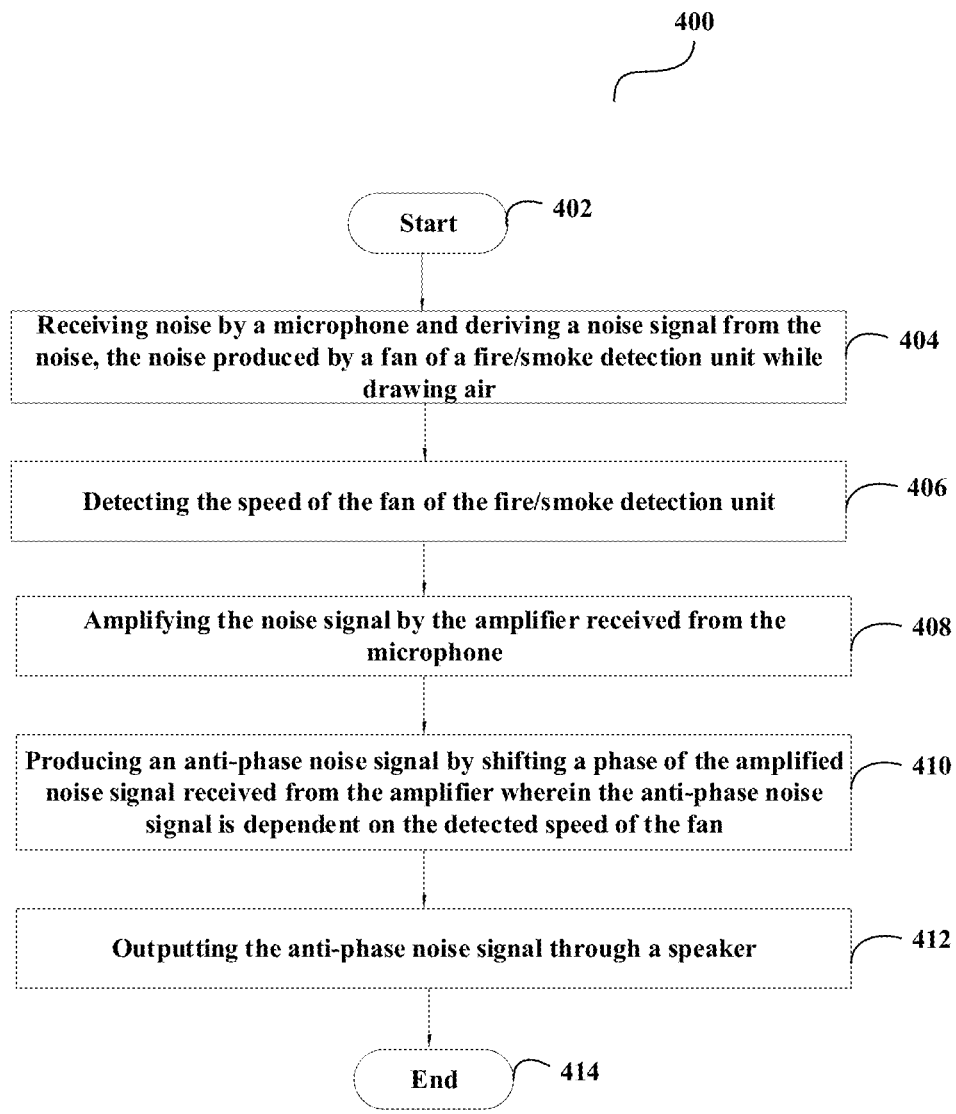
FIG. 4 depicts an exemplary flowchart illustrating a method to perform the invention according to an exemplary embodiment of the invention.

FIG. 4 depicts a flowchart outlining the features of the invention in an exemplary embodiment of the invention. The method flowchart 400 describes a method for suppressing noise produced by a fire/smoke detection unit/s 102. The method flowchart 400 starts at step 402.

At step 404, microphone/s 202 of a noise cancellation unit 112 may receive noise as an input from one or more fans 104 of a fire/smoke detection unit 102. The microphone 202 of the noise cancellation unit 112 may derive a noise signal from the noise produced by the one or more fans 104 while drawing air from surroundings.

At step 406, a speed detection unit 212 of the noise cancellation unit 112 may detect a speed of the one or more fans 104 as discussed above.

At step 408, an amplifier 204 of the noise cancellation unit 112 may amplify the noise signal received from the microphone 202. In an exemplary embodiment, the amplifier 204 may amplify a frequency of the noise signal as illustrated in FIG. 3C. In another exemplary embodiment, the amplifier 204 may amplify an amplitude of the noise signal as illustrated in FIG. 3B. After amplifying the noise signal, the amplifier 204 may output an amplified noise signal and may provide the amplified noise signal to a phase-shift unit 208.

At step 410, the phase-shift unit 208 of the noise cancellation unit 112 may shift a phase of the amplified noise signal to produce an anti-phase noise signal. In an exemplary embodiment, the phase-shift unit 208 may shift or change a phase of the amplified noise signal by 180 degrees. Further, the phase-shift unit 208 may shift or change a phase of the amplified noise signal in such a way that the anti-phase noise signal is an inverted image of the amplified noise signal. Also, the phase-shift unit 208 may provide the anti-phase noise signal to a speaker 206. The anti-phase noise signal may also be dependent on the detected speed of the one or more fans 104 as explained above.

At step 412, the speaker 206 of the noise cancellation unit 112 may output the anti-phase noise signal received from the phase-shift unit 208. The speaker 206 may output the anti-phase noise signal as sound. This would suppress the noise produced by the one or more fans 104 of the fire/smoke detection unit 102. Then, the method flowchart 400 may end at 414.

The present invention is applicable to various fields such as, but not limited to, hospitality industry, museums, libraries, colleges, universities, hospitals, offices and any such building that is well known in the art and where the fire/smoke detection unit produces noise which needs to be suppressed.

The present invention provides the following technical advantages over the existing solutions a) suppresses noise produced by fan/s of fire/smoke detection unit, b) usage of a noise cancellation unit along with the fire/smoke detection unit to suppress noise produced by fan/s, and c) eliminates discomfort and disturbance caused to people because of noise produced by fan/s, d) automated way to reduce noise produced by fan/s.

The order of execution or performance of the operations in examples of the invention illustrated and described herein is not essential, unless otherwise specified. That is, the operations may be performed in any order, unless otherwise specified, and examples of the invention may include additional or fewer operations than those disclosed herein. For example, it is contemplated that executing or performing a particular operation before, contemporaneously with, or after another operation is within the scope of aspects of the invention.

When introducing elements of aspects of the invention or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C".

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A system comprising:
a fire/smoke detection unit comprising:
a fan adapted to draw air through a conduit, the fan producing a noise while drawing the air; and
a noise cancellation unit communicably coupled with the fire/smoke detection unit, the noise cancellation unit comprising:
a microphone adapted to receive the noise of the fan and deriving a noise signal from the noise;
a speed detection unit to detect a speed of the fan;
an amplifier adapted to amplify the noise signal received from the microphone;
a phase-shift unit adapted to shift a phase of the amplified noise signal received from the amplifier to produce an anti-phase noise signal, wherein the anti-phase noise signal is dependent on the detected speed of the fan; and
a speaker adapted to output the anti-phase noise signal received from the phase-shift unit;
wherein an amplitude of the anti-phase noise signal is based on the speed of the fan, wherein the speed of the fan is mapped to the amplitude of the anti-phase noise signal in decibels (dB).

2. The system of claim 1, wherein the anti-phase noise signal suppresses the noise produced by the fan of the fire/smoke detection unit.

3. The system of claim 1, wherein the noise signal and the anti-phase noise signal are at 180 degree of phase shift with respect to each other.

4. The system of claim 1, wherein the amplifier amplifies the noise signal based on a threshold value required to suppress the noise produced by the fan.

5. The system of claim 1, wherein the microphone and the fan are located in proximity with each other.

6. The system of claim 1, wherein the speaker and the fan are located in proximity with each other.

7. The system of claim 1, wherein the noise cancellation unit comprises a power amplifier to amplify the anti-phase noise signal produced by the phase-shift unit.

8. The system of claim 1, wherein the fire/smoke detection unit is placed inside a premises.

9. The system of claim 1, wherein the speed of the fan is mapped with the frequency of the anti-phase noise signal.

10. A method comprising:
receiving a noise by a microphone and deriving a noise signal from the noise, the noise produced by a fan of a fire/smoke detection unit while drawing air;
detecting a speed of the fan of the fire/smoke detection unit;
amplifying the noise signal by the amplifier received from the microphone;
producing an anti-phase noise signal by shifting a phase of the amplified noise signal received from the amplifier wherein the anti-phase noise signal is dependent on the detected speed of the fan; and
outputting the anti-phase noise signal through a speaker;
wherein an amplitude of the anti-phase noise signal is based on the speed of the fan,
wherein the speed of the fan is mapped to the amplitude of the anti-phase noise signal in decibels (dB).

11. The method of claim 10, wherein the anti-phase noise signal suppresses the noise produced by the fan of the fire/smoke detection unit.

12. The method of claim 10, wherein the noise signal and the anti-phase noise signal are at 180 degree of phase shift with respect to each other.

13. The method of claim 10, wherein the amplifier amplifies the noise signal based on a threshold value required to suppress the noise produced by the fan.

14. The method of claim 10, wherein the microphone and the fan are located in proximity with each other.

15. The method of claim 10, wherein the speaker and the fan are located in proximity with each other.

16. The method of claim 10, wherein the anti-phase noise signal produced by the phase-shift unit is amplified by a power amplifier.

17. The method of claim 10 wherein the fan draws air through a conduit coupled with the fire/smoke detection unit.

* * * * *